United States Patent [19]
Schulmann et al.

[11] Patent Number: 6,010,569
[45] Date of Patent: Jan. 4, 2000

[54] DEVICE FOR HANDLING HEAVY COMPONENTS OF A CRYSTAL PULLER ACCORDING TO THE CZOCHRALSKI METHOD WHICH IS SUPPORTED IN A SUPPORTING FRAME

[75] Inventors: Winfried Schulmann, Kleinostheim; Udo Wenske; Helmut Kaiser, both of Bruchköbel; Franz Thimm, Alzenau, all of Germany

[73] Assignees: Balzers and Leybold Deutschland Holding AG; Leybold Systems GmbH, both of Germany

[21] Appl. No.: 09/034,364

[22] Filed: Mar. 4, 1998

[30] Foreign Application Priority Data

Mar. 6, 1997 [DE] Germany .............. 197 09 212

[51] Int. Cl.7 .................................................. C30B 35/00
[52] U.S. Cl. .................. 117/218; 117/216; 117/221; 117/911
[58] Field of Search ................... 117/216, 218, 117/221, 911

[56] References Cited

U.S. PATENT DOCUMENTS 5,176,490  1/1993  Ibe ........................................... 414/626
5,762,703  6/1998  Schulmann et al. ....................... 117/13
5,846,322  12/1998  Schulmann et al. ..................... 117/216

FOREIGN PATENT DOCUMENTS 460 477  5/1991  European Pat. Off. .

OTHER PUBLICATIONS

Patent Abstracts of Japan No. 63–201089 dated Aug. 8, 1988.

Patent Abstracts of Japan No. 4–321583 dated Nov. 11, 1992.

*Primary Examiner*—Felisa Hiteshew
*Attorney, Agent, or Firm*—Smith, Gambrell & Russell, LLP

[57] ABSTRACT

In a device for handling heavy components of a crystal puller according to the Czochralski method, a supporting beam that can be pivoted about one vertical leg of a supporting frame and vertically adjusted includes holding claws for accommodating components or auxiliary devices. Profile rails, on which a carriage can be laterally displaced, are arranged perpendicular to the supporting beam. The carriage can be connected to a receptacle for gripping and holding the crystal.

6 Claims, 5 Drawing Sheets

DEVICE FOR HANDLING HEAVY COMPONENTS OF A CRYSTAL PULLER ACCORDING TO THE CZOCHRALSKI METHOD WHICH IS SUPPORTED IN A SUPPORTING FRAME

INTRODUCTION AND BACKGROUND

The present invention pertains to a device for handling heavy components of a crystal puller according to the Czochralski method which is supported in a supporting frame, wherein the crucible that is supported on a supporting bolt is heated inside the pulling chamber by the thermal radiation of a heating element that surrounds the crucible, and wherein the crystal is pulled up from the surface of the molten mass into a lock chamber by means of a pulling device arranged above the molten mass, comprising a horizontally arranged supporting beam that can be vertically displaced and pivoted about the vertical line, preferably about one leg of the supporting frame.

According to the conventional pulling process, the crystal is pulled from a molten mass situated in a crucible under reduced pressure in a vacuum or a protective gas atmosphere, wherein the crucible is arranged on a crucible supporting bolt in a vacuum chamber that is supported by a supporting frame and heated by the thermal radiation of a heating element, and wherein a pulling element is provided above the molten mass. In this case, the crystal is pulled up from the surface of the molten mass into a lock chamber.

After separating the crystal from the puller by fracturing or cutting the seedling, the crucible can be removed from the lock chamber. When processing smaller crystal diameters up to approximately 150 mm, this can be carried out manually. However, when processing larger diameters, auxiliary devices are required for supporting the weight of the crystal before the seedling is severed and allowing the lateral removal from the sluice chamber. Crystal pullers for crystals of larger diameter also have larger dimensions and greater weight. When pulling a crystal with a diameter of 300 mm, quartz crucibles with a batch weight up to 250 kg are utilized. The insertion and removal of such crucibles can only be realized with mechanical devices. This applies correspondingly to all other components and elements of the system which can no longer be moved manually.

A number of devices already exist which, however, pertain exclusively to the removal of the crystal.

For example, supporting elements have been proposed that are inserted in the bottom of a tube, which has a larger diameter than the crystal and which is mounted onto the lock chamber door and surrounds the crystal, with the aid of a swivel valve that separates the lock chamber from the pulling chamber. This is carried out in such a way that the weight of the crystal is supported after it is lowered onto the supporting elements, and the crystal can be pivoted outward together with the door while located inside the tube (DE 196 08374.5, not yet published).

In addition, a laterally separable decoupling device has been proposed which comprises a coupling ring that is mounted on the pulling element as well as a mushroom-shaped head part, on which the crystal is suspended (DE 195 38857.7, not yet published).

In U.S. Pat. No. 4,350,560, the removal of the crystal is realized by laterally pivoting away the lock chamber with the crystal and subsequently lowering the crystal into a supply container through the open bottom of the lock chamber.

SUMMARY OF THE INVENTION

An object of the present invention is to provide a device for manipulating heavy components of a crystal puller, e.g., the crucible, the heating device, the crucible cover or the vacuum tank in such a way that the aforementioned components can be handled with only one device that also allows the removal of the crystal.

The above and other objects of the present invention are attained by providing the device with a supporting rail that extends parallel to the main axis of the pulling chamber and comprises a horizontally extending supporting beam that can be vertically adjusted and pivoted about the vertical line on one of the legs of the supporting structure that accommodates the crystal puller, wherein said supporting beam is provided with holding claws for attaching various auxiliary devices in order to accommodate tank parts and other structural components or at least one pair of gripping pliers, and wherein said supporting beam containing a carriage that can be displaced transverse to the supporting beam and serves for taking hold of and removing the crystal while the lock chamber is open.

BRIEF DESCRIPTION OF THE DRAWINGS

The invention allows various embodiments that may be realized in similar fashion to a modulator system. One embodiment is schematically illustrated in the accompany figures, wherein.

DETAILED DESCRIPTION OF THE INVENTION

Figure 1:
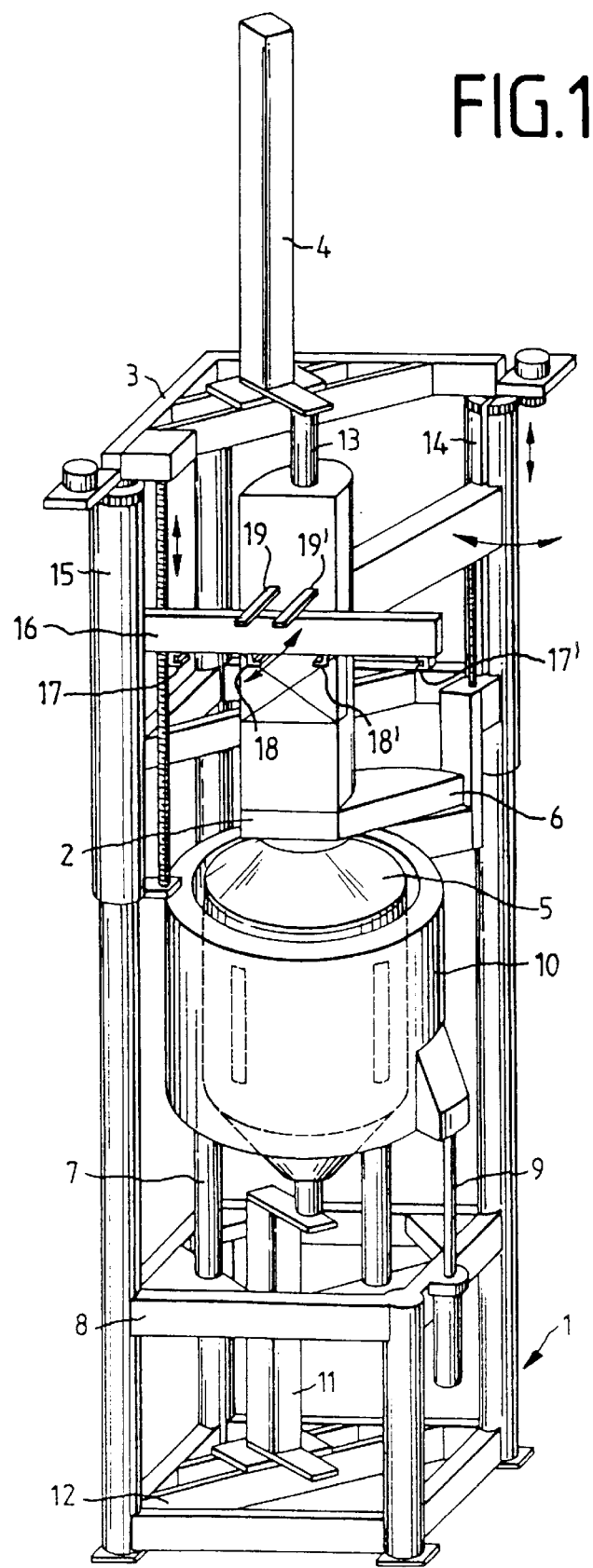
FIG. 1 illustrates a schematic perspective representation of a crystal puller with a device according to the invention mounted in a supporting frame.
Figure 2:
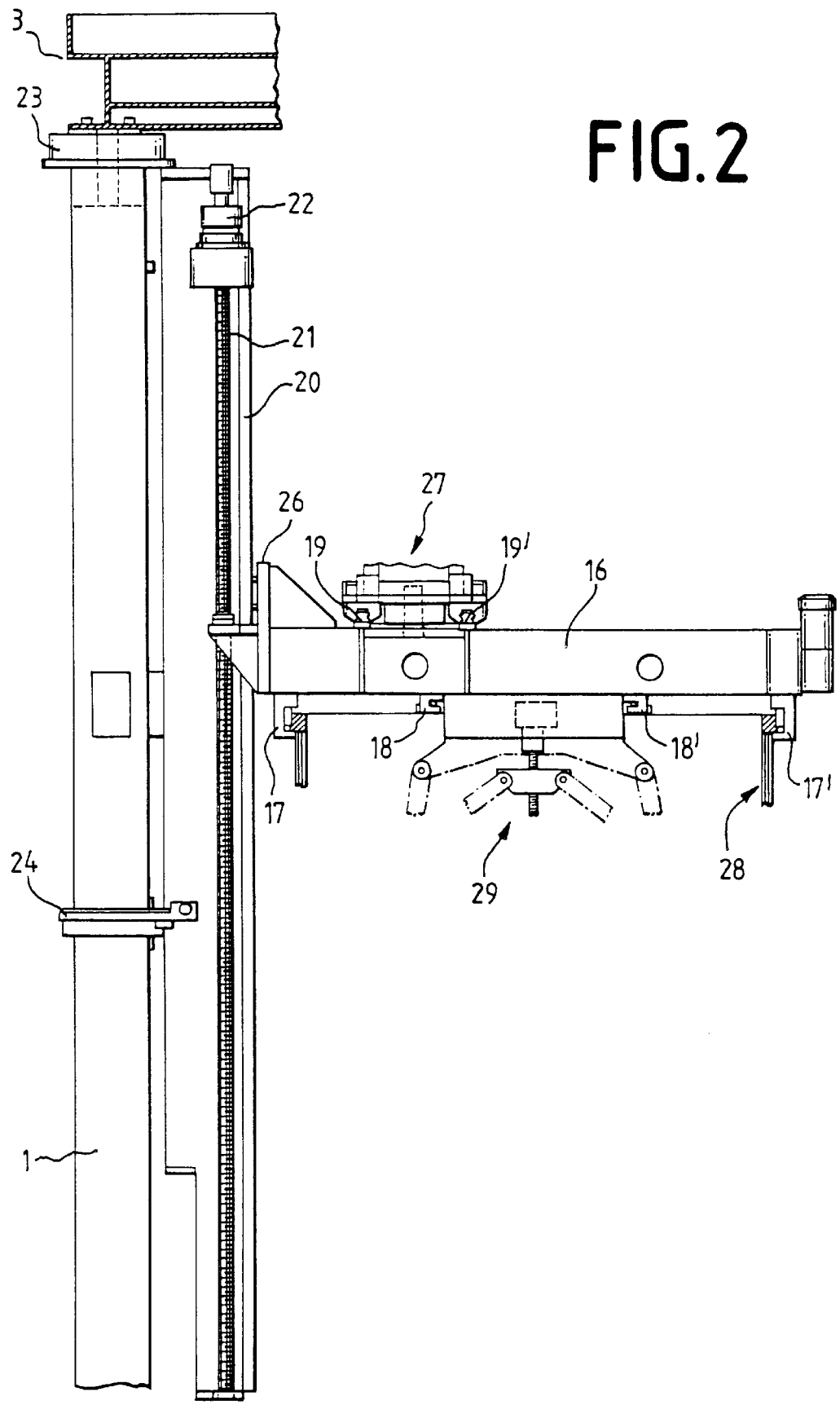
FIG. 2 is a partial elevation view of an embodiment of the device according to the invention for removing the crystals, accommodating the pulling vessel and attaching a pair of gripping pliers.

FIG. 1 shows a crystal puller that is mounted in a supporting frame 1 that includes an end frame 3. A driving spindle 4 is attached to the top of the end frame 3. The driving spindle 4 drives a pulling shaft 13 that extends into a lock chamber 2. The lock chamber 2 is attached via an arm to one leg of the supporting frame 1 such that the lock chamber 2 may rotate about the leg on a drag bearing 14 in the horizontal plane. The lock chamber 2 engages the profile rails 19, 19' of a handling device 15. The lock chamber 2 has a shutter 6 to close and open an opening between the lock chamber 2 and a vacuum chamber 5, which rests on a crucible support 11 resting on a horizontal support 12 at the bottom of the support frame 1. The vacuum chamber 5 with the crucible cylinder is encompassed by a ring-shaped magnet 10. The magnet 10 is supported by posts 7 which extend from a mid-support frame 8. Attached to the magnet 10 is an elevator bar 9 to move the magnet 10 in the vertical direction.

The handling device 15 that can be vertically adjusted by means of a spindle drive and pivoted about the vertical line is arranged parallel to one leg of this frame. The handling device 15 is illustrated in more detail in FIGS. 2–5. A supporting rail 20 is coupled to one leg of the supporting frame 1 by means of rotatable holding devices 23 and 24 such that it can be pivoted about the vertical line. The carriage 26 is displaced along the supporting rail by means of the spindle 21 that is driven by the motor 22. The carriage 26 moves vertically on the spindle 21 via the spindle nut 25 that is rigidly connected to the carriage 26. A supporting beam 16 that is realized in the form of a hollow body is connected to the carriage 26 perpendicular to the supporting rail 20. This supporting beam 16 includes holding elements in the form of holding claws (17, 17' and 18, 18') for attaching a flange of a vessel part 28 or a holding flange for a gripper 29. The supporting beam 16 also includes profile rails (19, 19') that serve for accommodating a support carriage 27 and extend approximately perpendicular to the longitudinal axis of the supporting beam 16.

Figure 3:
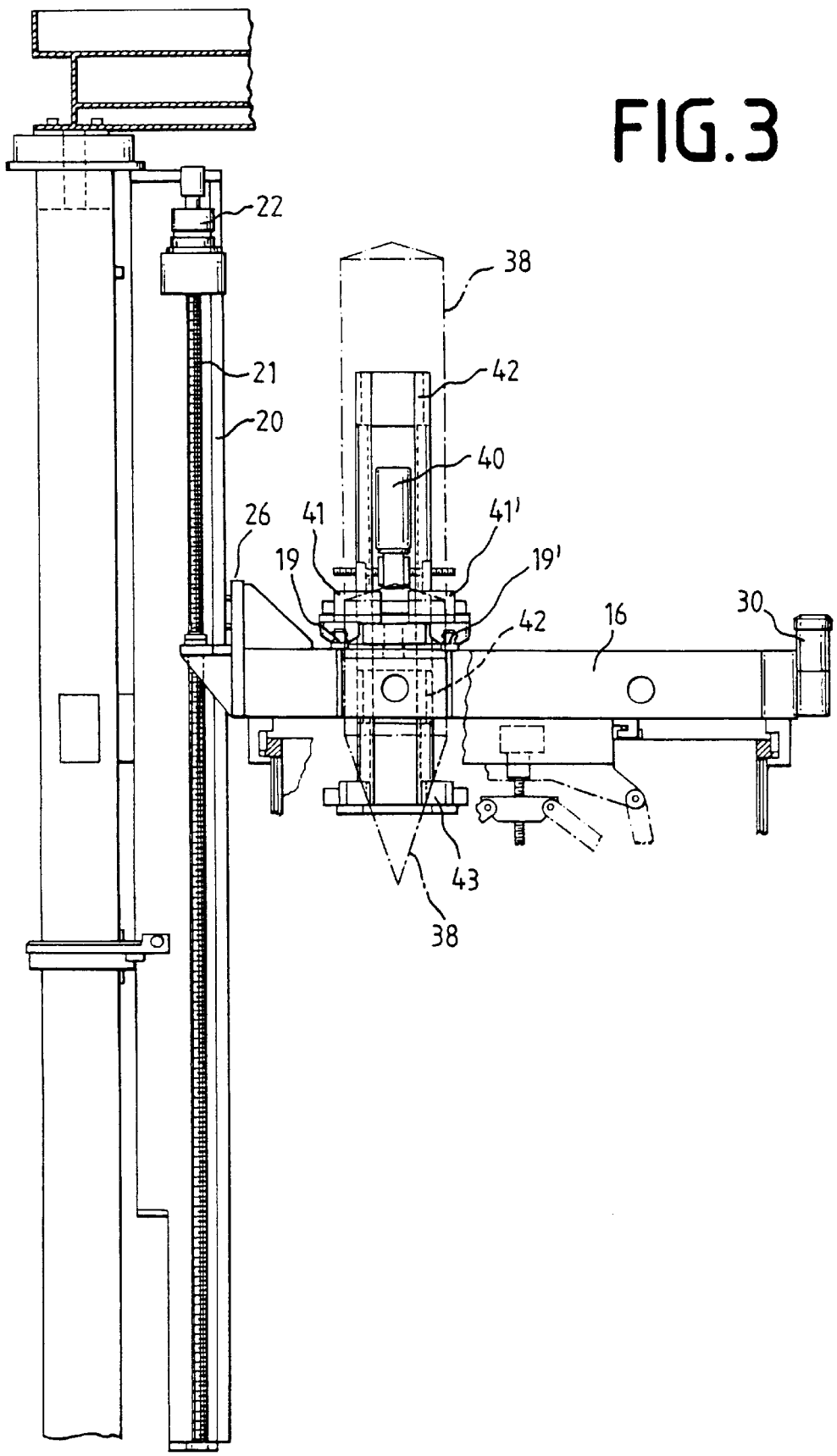
FIG. 3 is a partial elevation view of the supporting beam with an attached crystal removal device.

The support carriage 27 can be connected to a crystal removal device as shown in FIG. 3. This crystal removal device can be horizontally displaced via a linear drive that is not illustrated in detail. During the removal of a crystal, the carriage moves into the removal position while the lock chamber 2 is open. In this removal position, the tip of the crystal already extends through the receptacle flange 43. In order to insert the tip of the crystal, the receptacle flange 43 is realized in the form of an open ring. After the crystal 38 is lowered, the receptacle flange 43 supports the weight of the crystal 38. Two gripping claws 41, 41' that surround the crystal 38 in jaw-like fashion and thus hold the crystal such that it is securely and carefully locked in the limit stop of the support 42 can be actuated via the drive motor 40 that is connected to a double spindle. After severing the crystal 38 from the seedling, the crystal can be moved into the intended removal position by laterally displacing the crystal and pivoting it outwardly.

Figure 4:
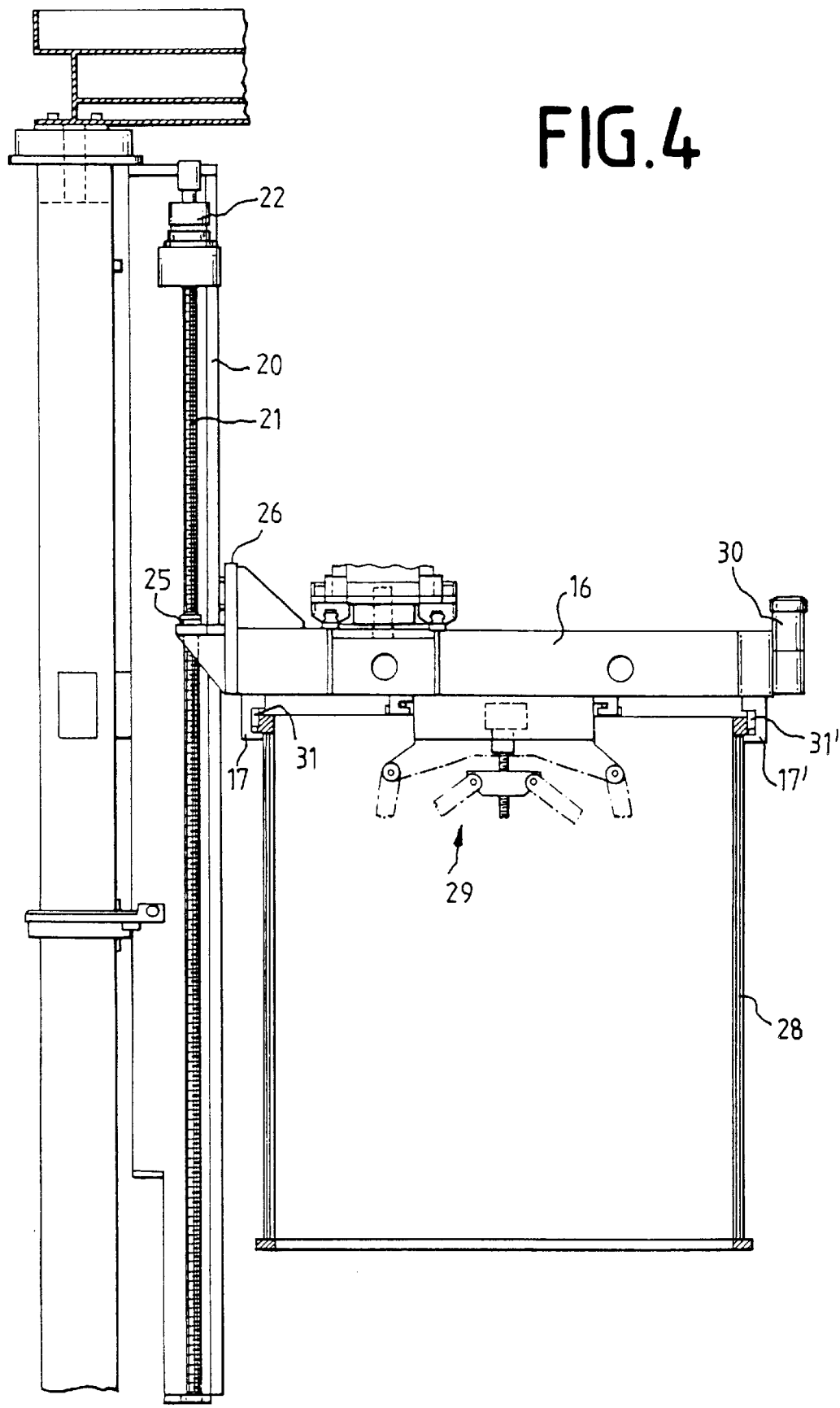
FIG. 4 is a partial elevation view of the supporting beam with an attached pulling vessel.

FIG. 4 shows the function of the handling device when removing a vessel part. The supporting beam 16 with its holding claws 17, 17' is horizontally pivoted above the vessel flange. A kinematic device provided in the supporting beam 16 ensures that the connection between the holding claws 17, 17' and the flange is secured by means of locking bolts 31, 31'. For this purpose, the bolts are moved into the respective locking position by means of a horizontal shaft that is driven by the motor 30, i.e., the flange and the holding claw cannot be laterally displaced relative to one another.

Figure 5:
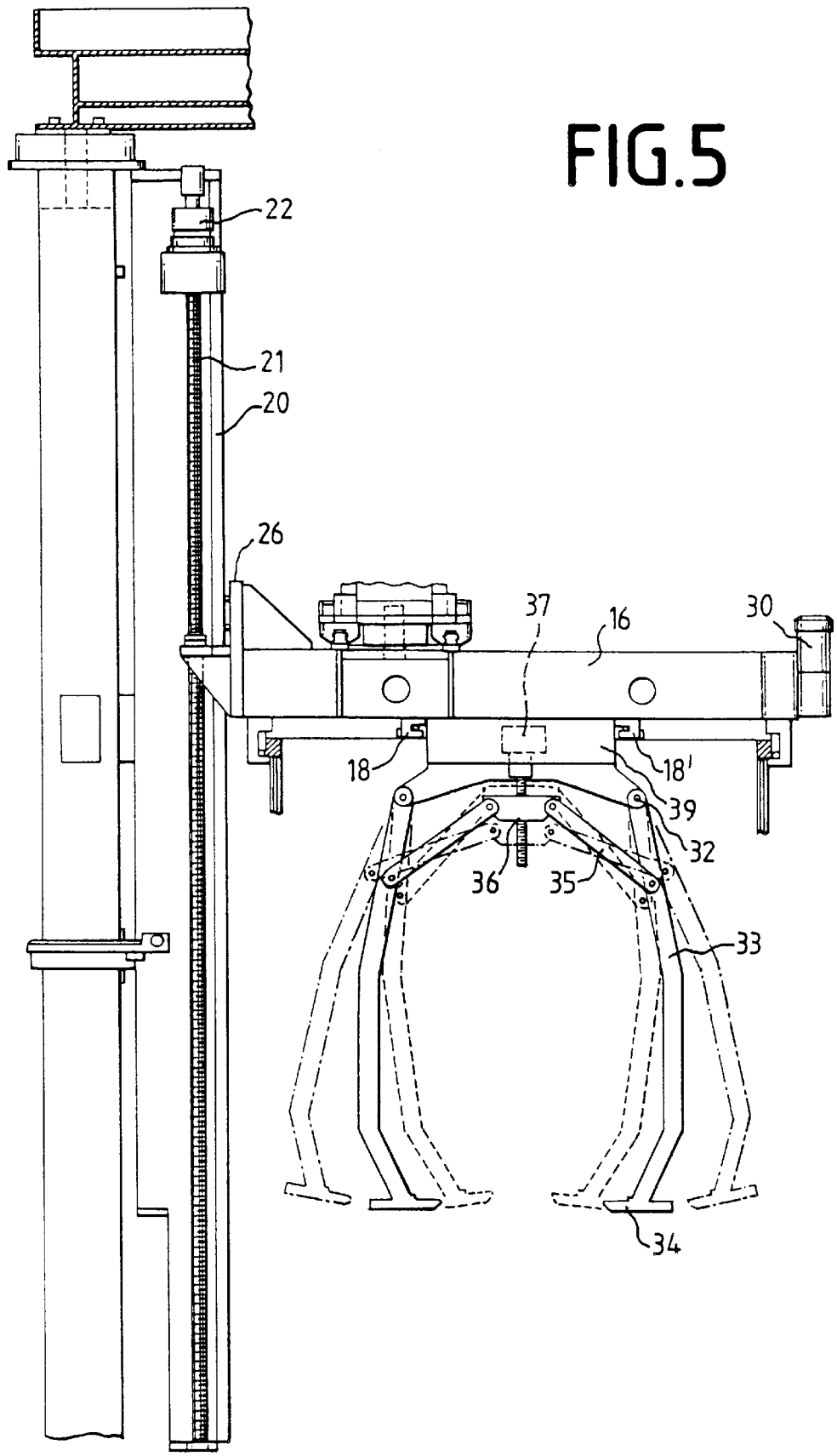
FIG. 5 is a partial elevation view of the supporting beam with an attached pair of gripping pliers.

In FIG. 5, a holding flange 39 is attached to the inner holding claws 18, 18'. This holding flange 39 carries a multi-armed gripper. This gripper consists of several one-armed gripping arms 33 that are suspended on the circumference of the holding flange 39 such that they can be pivoted about the pivot point 32. In addition, these gripping arms are provided with projections or tappets 34 on their gripping ends which serve for selectively gripping corresponding components, e.g., heaters or crucibles, on the inside or the outside. The gripping arms are coupled to the spindle nut 36 by means of braces 35 such that they can be moved into the closed or open position via the drive 37. If the graphite heater that, for example, is arranged concentric to the crucible is provided with corresponding openings, the gripper can be moved into the open position while the gripping arms 33 are spread apart by lowering the spindle nut 36. In this case, the outer tappets 34 engage into the openings of the heater, and the heavy heater can be lifted by raising the supporting beam 16.

The previously discussed embodiments are only described as examples. A series of auxiliary devices can be a manipulated with the handling device according to the invention.

Further modification and variations will be apparent to those skilled in the art from the foregoing and are intended to be encompassed by the claims appended hereto.

German priority application 197 09 212.8 is relied on and incorporated herein by reference.

We claim:

1. A device for handling heavy components of a crystal puller according to the Czochralski method which is supported in a supporting frame, wherein a crucible that is supported on a supporting bolt is heated inside a pulling chamber by the thermal radiation of a heating element that surrounds the crucible, and wherein the crystal is pulled upward from the surface of the molten mass into a lock chamber by means of a pulling device arranged above the molten mass, comprising a horizontally arranged supporting beam that can be vertically displaced and pivoted about the vertical line, the supporting beam having profile rails arranged perpendicular to the supporting beam and holding claws for accommodating puller components or auxiliary devices mounted on flange rings, the holding claws or auxiliary devices serve for manipulating puller components, and a movable carriage on which a receptacle for gripping and holding the crystal is mounted, the movable carriage engages the profile rails, wherein the receptacle for holding and gripping the crystal includes a slotted holding ring on which the conical crystal end is supported after a lowering process, and wherein pivoted gripping laws are arranged above the holding ring.

2. The device according to claim 1, wherein the auxiliary devices include a gripper having replaceable gripping arms.

3. The device according to claim 2, wherein the gripping arms having end pieces or tappets on both sides.

4. The device according to claim 1, wherein the supporting beam has locking elements to secure accommodated components in the holding claws or the movable carriage.

5. The device according to claim 1, wherein the supporting beam has sensors that indicate the status of the separable holding devices.

6. The device according to claim 1 wherein said support beam is pivoted about a leg of the supporting frame.

* * * * *